(12) United States Patent
Kermani et al.

(10) Patent No.: US 6,275,068 B1
(45) Date of Patent: Aug. 14, 2001

(54) PROGRAMMABLE CLOCK DELAY

(75) Inventors: Bahram Ghaffarzadeh Kermani, Whitehall; Clinton Hays Holder, Jr., Slatington, both of PA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/469,905

(22) Filed: Dec. 22, 1999

(51) Int. Cl.[7] .................................................. H03K 5/13
(52) U.S. Cl. ........................... 326/93; 327/276; 327/270
(58) Field of Search .................................... 327/276, 277, 327/278, 281, 288, 261, 263, 264, 269, 270, 271; 326/93

(56) References Cited

U.S. PATENT DOCUMENTS

| 5,126,691 | 6/1992 | Mijuskovic et al. . | |
| 5,268,656 | 12/1993 | Muscavage | 331/45 |
| 5,438,300 | * 8/1995 | Saban et al. | 331/16 |
| 5,828,870 | 10/1998 | Gunadisastra | 395/558 |
| 5,838,179 | 11/1998 | Schmidt | 327/156 |
| 5,841,296 | 11/1998 | Churcher et al. | 326/49 |
| 5,881,271 | 3/1999 | Williams | 395/552 |
| 5,923,611 | 7/1999 | Ryan | 365/233 |
| 5,926,837 | 7/1999 | Watanabe et al. | 711/167 |
| 6,046,620 | * 4/2000 | Relph | 327/277 |
| 6,130,567 | * 10/2000 | Kobayashi | 327/278 |
| 6,150,863 | * 11/2000 | Conn et al. | 327/270 |

FOREIGN PATENT DOCUMENTS 64-1322-a * 1/1989 (JP) ..................................... 327/278

* cited by examiner

*Primary Examiner*—Tuan T. Lam
(74) *Attorney, Agent, or Firm*—Ratner & Prestia

(57) ABSTRACT

In an integrated circuit, a system and method of programmably controlling the delay between a second clock signal with respect to a first clock signal after fabricating the integrated circuit. Prior to fabrication, a programmable delay group is formed and will be included in the integrated circuit. The programmable delay group includes a plurality of parallel coupled sets of delay stages. Each set having at least one delay stage. For the sets having more than one delay stage, the delay stages are serially coupled. After fabrication of the integrated circuit and in operation, the first clock signal is applied to one end of each of the sets of delay stages. The enable signals are generated and applied to the programmable delay group in order to enable one of the sets of delay stages. The enabled set delays the first clock signal, thereby producing the second clock signal at the other end of the enabled set and hereby controlling the delay of the second clock signal.

8 Claims, 2 Drawing Sheets

PROGRAMMABLE CLOCK DELAY

FIELD OF THE INVENTION

The present invention relates to integrated circuits, and in particular to a circuit and methodology that allows for the dynamic modification of skew between clocks within a integrated circuit using software.

BACKGROUND OF THE INVENTION

In designing complex systems like today's integrated circuits, where multiple clocks are used, the skew between clocks is often a crucial issue. This is particularly important when the integrated circuit has already been fabricated and it then becomes important to change the delay or skew between clocks. High frequency clock signals can be routed throughout an integrated circuit to multiple blocks of devices such as a hardware accelerators, DSP processors, and random access memories. It is desirable to have clock signals arrive at all hardware blocks at precisely controlled times, which may not be simultaneous. If the correct skew between the competing clocks is not properly set during the design of the integrated circuit, there would be a possibility for race conditions in the circuit and thus system failure. Once the integrated circuit is fabricated skew between clocks is hard tuned i.e. the relationship between the various clocks and the system can not be changed without a mask change which may be very costly and time consuming.

To design clock circuitry and properly set clock skew within an integrated circuit most designers typically use simulation tools. The problem is that simulation tools do not necessarily match the post fabrication characteristics of the integrated circuit. Discrepancies between the simulation models and the physical chip leaves the system susceptible to variations in delays and circuit timing that may not be accounted for. One of the most prevalent variations of this type is clock skew. Designers try to accommodate for clock skew variations in their designs by placing known delays in the circuit or placing clock uncertainties in the design constraints. These techniques usually yields only marginal results.

Another method of solving variations in clock skew is to use more realistic simulation delay models. These models may be developed by extracting the post layout and fabrication parasitic values in order to modify the models. This technique still requires the integrated circuit to be re-simulated with the new models. The integrated circuit must then go back through the fabrication and testing process. Using this technique has the problem of requiring extensive time to re-simulate and complete a second fabrication of the integrated circuit, which may not be possible due to the ever increasing time to market pressure. Even in scenarios where post layout RC parasitic values are taken into account, there would be no guarantee that the fabricated integrated circuit will behave as it was predicted because the models, due to their simplicity, do not necessarily follow the physical design parameters.

SUMMARY OF THE INVENTION

In an integrated circuit, a method of programmably controlling the delay between a second clock signal with respect to a first clock signal after fabricating the integrated circuit. Prior to fabrication, a programmable delay group is formed and will be included in the integrated circuit. The programmable delay group includes a plurality of parallel coupled sets of delay stages with each set having at least one delay stage, serially coupling the delay stages for the sets having more than one delay stage.

After fabrication of the integrated circuit and in operation, the first clock signal is applied to one end of each of the sets of delay stages. The enable signals are generated and applied to the programmable delay group in order to enable one of the sets of delay stages. The enabled set will delay the first clock signal and produce the second clock signal at the other end of the enabled set and hereby controlling the delay of the second clock signal.

In another embodiment, a programmable clock delay system having first and second clock input signals generates first and second clock output signals, skewed with respect to the first and second clock input signals, respectively. This system has a first programmable delay group that includes a plurality of parallel coupled sets of delay stages coupled, all at one end, to the first clock input. Each set of delay stages has at least one delay stage. For the sets having more than one delay stage, each delay stage is serially coupled to the next. The other end of each set is coupled together to produce a first clock output signal for the first programmable delay group.

A second programmable delay group includes a plurality of parallel coupled sets of delay stages coupled, all at one end, to receive the second clock input. Each set of delay stages has at least one delay stage. For the sets having more than one delay stage, each delay stage is serially coupled to the next. The other end of each set is coupled together to produce a second clock output signal for the second programmable delay group.

A first control circuit provides enable signals to a delay stage in each set of the first programmable delay group. The enable signals selectively enable one of the sets of delay stages, which when enabled provides a delay path to delay the first clock input and transmit the first clock output signal. A second control circuit provides enable signals to a delay stage in each set of the second programmable delay group. This selectively enables one of the sets to delay the second clock and transmit the second clock output signal.

A circuit provides programmable control signals to the first and second control circuits to provide first and second clock output signals skewed with respect to the first and second clock input signals, respectively.

DETAILED DESCRIPTION OF THE INVENTION

Figure 1:
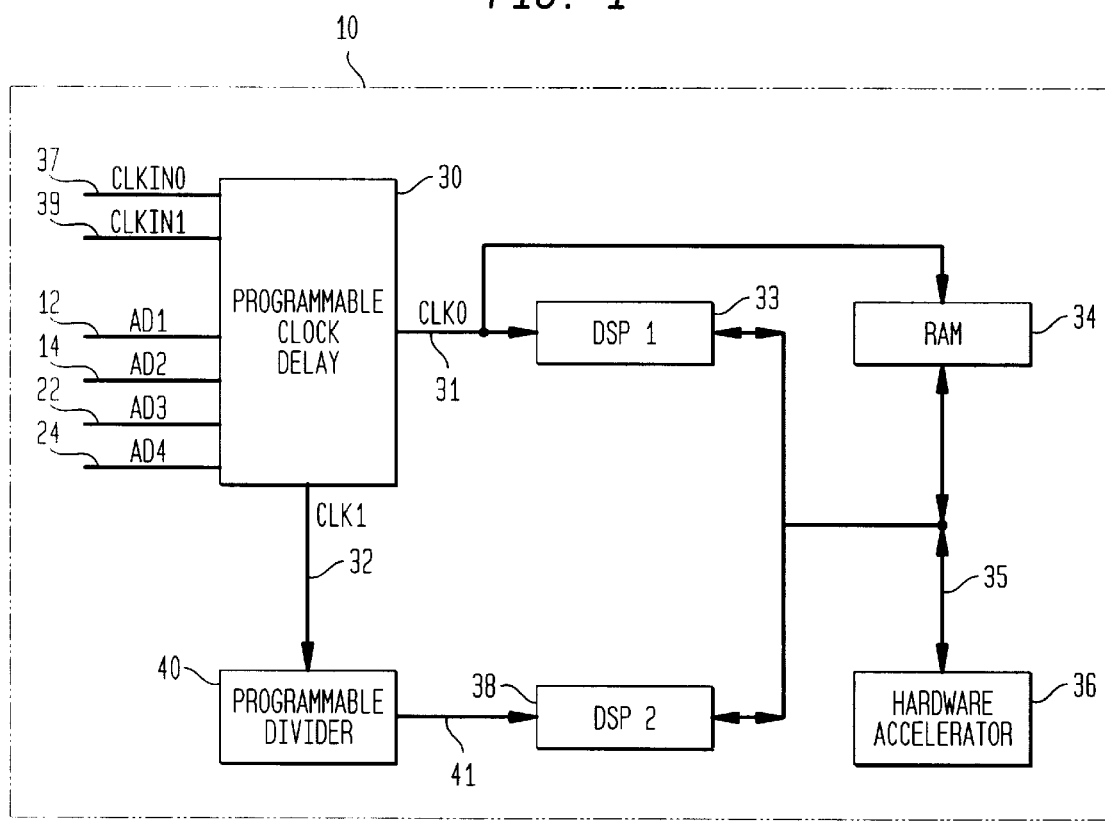
FIG. 1, is a block diagram of an exemplary embodiment of the present invention within an integrated circuit.

Referring to FIG. 1, a schematic diagram illustrating a programmable clock delay circuit 30 within an integrated circuit 10 having a plurality of circuit blocks is shown. The programmable clock delay circuit 30 receives two input clock signals CLKIN0 37 and CLIN1 39 and generates two skewed clocks CLK0 31 and CLK1 32 as outputs. The first output clock signal CLK0 31 is generated by delaying the first input clock CLKIN0 37 by a programmable amount. From the programmable clock delay circuit 30, the first output clock signal CLK0 31 is distributed throughout the integrated circuit 10 to blocks DSP1 33 and RAM 34.

The second output clock signal CLK1 32 is generated by delaying the second input clock CLKIN1 39 by a programmable amount. The second output clock signal CLK1 32 is also distributed throughout the integrated circuit 10. In an exemplary embodiment the second output clock signal CLK1 32 is applied to a programmable divider 40 where the clock can be divided into different frequencies and further distributed throughout the integrated circuit. The divider can receive as inputs any of the clock signals and provide one or multiple divided by N (where N is an integer) signals. The divided output may be derived on a cycle basis or a phase basis. In this illustration the output 41 of the programmable divider 40 is coupled to the DSP2 block 38. The internal data and signal bus 35 couples various circuit block together including the hardware accelerator 36 and is used by the various circuit blocks to communicate with each other. The timing on the bus 35, with respect to its interaction with the various circuit blocks, is critical. Since CLK0 31 and CLK1 32 control the timing within their respective circuit blocks, the skew between the clocks, CLK0 31 and CLK1 32, is critical to maintaining the bus 35 timing.

The relationship between the two clocks is tightly controlled and adjusted by programming the programmable clock delay circuit 30 using the control signal inputs AD1 12, AD2 14, AD3 22, AD4 24. This programming is accomplished by applying a binary address to each pair of control signals [AD1–AD2] and [AD3–AD4]. The first pair [AD1–AD2] control the delay of the first output clock signal with respect to the first input clock signal. The second pair [AD3–AD4] control the delay of the second output clock signal with respect to the second input clock signal. Each different address applied to the pair of control signals changes the delay added to the input clock in order to generate its respective output clock. The programming of the control signals can be accomplished, for example, by a processor writing to a register (not shown) or having the control signals inputs coupled to external pins.

Table 1 shows the control signals AD1 and AD2 and the corresponding delay added to the CLKIN0 37 signal to produce the output clock CLK0 31. The first column shows a binary address to be applied to the control signals AD1 12 and AD2 14. The second column shows a corresponding delay which will be added to the CLKIN0 37 input to generate the first output clock CLK0 31. For example when [AD2–AD1]=10 then the first output clock CLK0 31 will be delayed from the first input clock CLKIN0 37 by 800 ps.

TABLE 1

| Control Signals [AD2–AD1] | Delay of output clock CLK0 (Pico Seconds) |
| --- | --- |
| 00 | 400 |
| 01 | 600 |
| 10 | 800 |
| 11 | 1000 |

Table 2 shows the control signals AD3 22 and AD4 24 and the corresponding delay added to the CLKIN1 39 signal to produce the second output clock CLK1 32. The first column shows a binary address to be applied to the control signals AD3 and AD4. The second column shows a corresponding delay which will be added to the CLKIN1 39 input to generate the second output clock CLK1 32. For example when [AD4–AD3]=10 then the second output clock CLK1 32 will be delayed from the second input clock CLKIN1 39 by 1200 ps.

TABLE 2

| Control Signals [AD4–AD3] | Delay of output clock CLK1 (Pico Seconds) |
| --- | --- |
| 00 | 400 |
| 01 | 800 |
| 10 | 1200 |
| 11 | 1600 |

Figure 2:
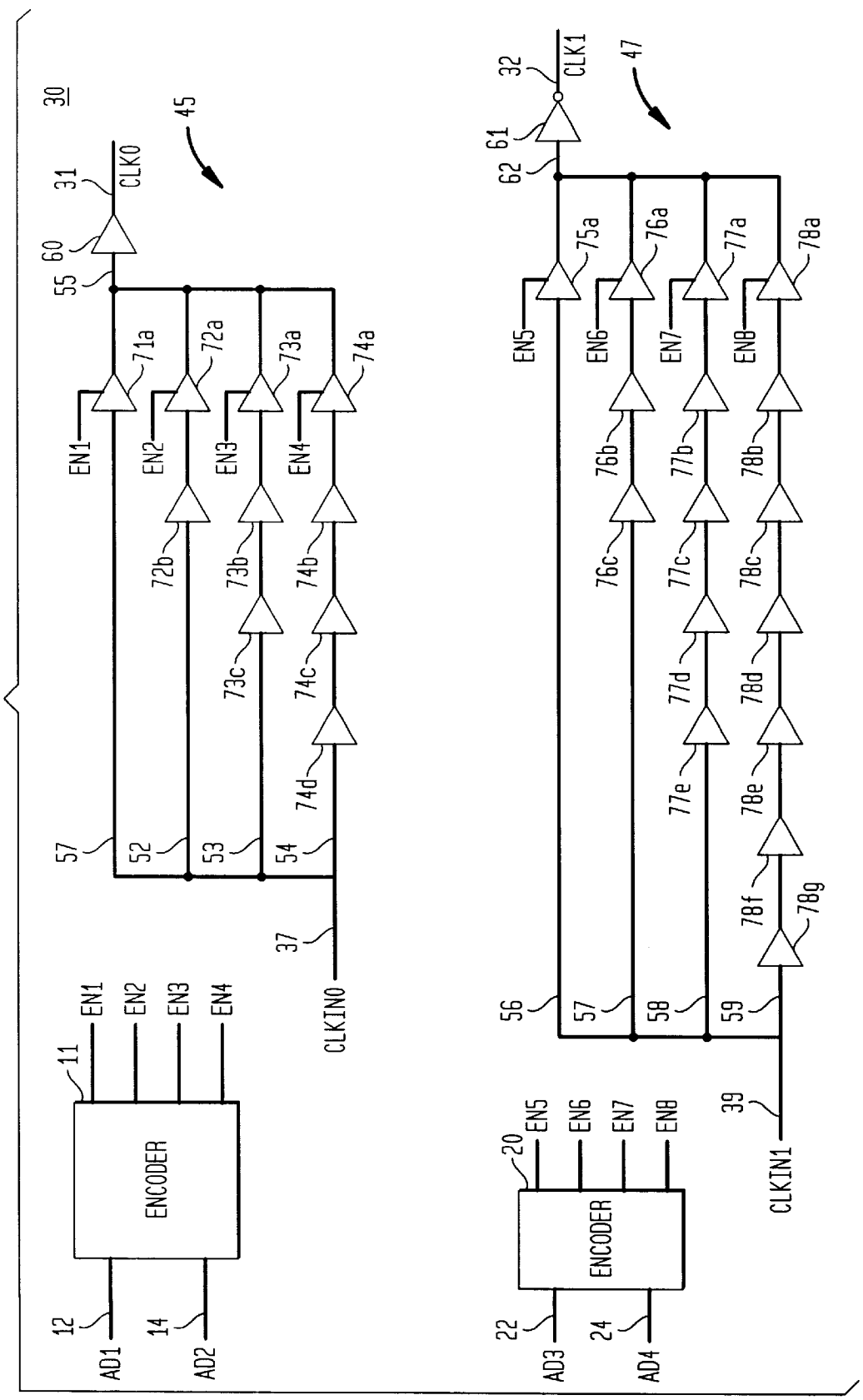
FIG. 2, is a block diagram of an exemplary embodiment of the present invention containing multiple delay elements to provide first and second clock outputs from first and second clock inputs, respectively.

FIG. 2 is a schematic diagram illustrating the programmable clock delay circuit 30. The programmable clock delay circuit 30 has two input clocks CLKIN0 37 and CLKIN1 39. Each input clock to the programmable clock delay circuit 30 but can be generated internally to the integrated circuit or can be coupled to an external pin. The programmable clock delay circuit 30 produces two clock output signals CLK0 31 and CLK1 32 which are programmably delayed from respectively, CLKIN0 37 and CLKIN1 39. The amount of delay is programmed by two pair of control signals: AD1 12 and AD2 14 control the first clock output CLK0 31 and AD3 22 and AD4 24 control the second clock output CLK1 32.

The first input clock CLKIN0 37 is coupled to the first programmable delay group 45. The first programmable delay group 45 has a plurality of sets of delay stages 51–54. The sets of delay stages are all coupled in parallel with one end of the sets of delay stages forming the input to the first programmable delay group 45 to which the first input clock CLKIN0 37 is coupled. The sets of delay stages 51–54 are made up of at least one delay stage, each delay stage having an input and an output. In a set of delay stages having more than one delay stage, the delay stages within the set are coupled in series. The other end of the sets of delay stages are coupled together at terminal 55. Terminal 55 is coupled through delay stage 60 to produce the first output clock signal CLK0 31 for the first programmable delay group 45.

The last delay stage in each set is controlled by a respective enable signal [EN1–EN4]. When the delay stage is enabled it will pass the clock signal. Thus, [EN1–EN4] are coupled respectively to enable inputs of delay stages 71a–74a. When the delay stage in not enabled the delay stage output will be tri-state. For example, if delay stage 72a in FIG. 2 is enabled, the clock signal will pass through the delay stage set 52. The enable signals for the first delay group 45 are controlled by the encoder 11. The encoder 11 has two inputs AD1 12 and AD2 14 which select one of the encoder outputs [EN1–EN4] to enable one of the delay stage sets 51–54 in the first delay group 45. This is illustrated in table 3. When an address is applied to the encoder 11 inputs AD1 12 and AD2 14 the encoder will send an enable signal to one of its outputs EN1–EN4. This will enable one of the corresponding sets of delay stages in the first delay group 45. The input clock CLKIN0 37 will pass through the set of delay stages which is enabled and will be transmitted as the first clock output signal CLK0 31. The first output clock CLK0 31 will be delayed from the first input clock CLKIN0 37 by the number of delay stages in the selected delays stage set.

TABLE 3

| Control Signals [AD2–AD1] | Encoder 11 Output [EN4–EN1] | Delay of output clock CLK0 (Pico Seconds) |
| --- | --- | --- |
| 00 | 0001 | 400 |
| 01 | 0010 | 600 |

TABLE 3-continued

| Control Signals [AD2–AD1] | Encoder 11 Output [EN4–EN1] | Delay of output clock CLK0 (Pico Seconds) |
| --- | --- | --- |
| 10 | 0100 | 800 |
| 11 | 1000 | 1000 |

In operation, for example, when AD1=0 and AD2=1, corresponding to row 3 of table 3, the output of the encoder 11 would be [EN4–EN1]=0100. This would enable the delay stage 73a and the first input clock CLKIN0 37 would be transmitted through the set of delay stages 73a–c. Each delay stage adds 200 ps to the input clock signal CLKIN0 37 with the resulting signal output from 73a being delay by 600 ps from CLKIN0 37. The signal is coupled to buffer 60 which adds another 200 ps delay to the clock signal. The output of the buffer 50 transmits the first clock output signal CLK0 31 which is delayed a total of 800 ps from the input clock CLKIN0 37. This corresponds to the third row of Table 3 which shows a delay of 800 ps.

The second input clock CLKIN1 39 is coupled to the second programmable delay group 47. The second programmable delay group 47 has a plurality of sets of delay stages 56–59. The sets of delay stages are all coupled in parallel with one end of the sets of delay stages forming the input to the second programmable delay group 47 to which the second input clock CLKIN1 39 is coupled. The sets of delay stages 56–59 are made up of at least one delay stage, each delay stage having an input and an output. In a set of delay stages having more than one delay stage, the delay stages within the set are coupled in series. The other end of the sets of delay stages are coupled together at terminal 62. Terminal 62 is coupled through inverter 61 to produce the second clock output signal CLK1 32 for the second programmable delay group 47.

The last delay stage in each set is controlled by a respective enable signal [EN5–EN8]. When the delay stage is enabled it will pass the clock signal. Thus, [EN5–EN8] are coupled respectively to enable inputs of delay stages 75a–78a. When the delay stage in not enabled the delay stage output will be tri-state. For example, if delay stage 76a in FIG. 2 is enabled, the clock signal will pass through the delay stage set 57. The enable signals for the second delay group 47 are controlled by the encoder 20. The encoder 20 has two inputs AD3 22 and AD4 24 which select one of the encoder outputs [EN5–EN8] to enable one of the delay stage sets 56–59 in the second delay group 47. This is illustrated in table 4.

TABLE 4

| Control Signals [AD4–AD3] | Encoder 20 Output [EN8–EN5] | Delay of output clock CLK1 + 180 phase shift (Pico seconds) |
| --- | --- | --- |
| 00 | 0001 | 400 |
| 01 | 0010 | 800 |
| 10 | 0100 | 1200 |
| 11 | 1000 | 1600 |

In operation, for example, when AD4=1 and AD3=0, corresponding to row 3 of table 4, the output of the encoder 20 would be [EN8–EN5]=0100. This would enable the delay stage 77a and the second input clock CLKIN1 39 would be transmitted through the set of delay stages 77a–e. Each delay stage adds 200 ps to the input clock signal CLKIN1 39 with the resulting signal output from 73a being delay by 1000 ps from CLKIN1 39. The signal is coupled to inverter 61 which adds another 200 ps delay to the clock signal and inverts the signal. The output of the inverter 61 transmits the second clock output signal CLK1 32 which is delayed a total of 1200 ps and phase shifted 180 degrees from the input clock CLKIN1 39. This corresponds to the third row of Table 4 which shows a delay of 1200 ps.

It is understood that the first circuit, in FIG. 2, which generates the first clock output signal CLK0 31 operates independently from the second circuit which generates the second clock output signal CLK1 32. Likewise the second circuit, which generates the second clock output signal operates independently from the first circuit. It will be understood that an exemplary embodiment may contain one of the clock delay circuits.

What is claimed:

1. A programmable clock delay system having first and second clock inputs, comprising:

a first programmable delay group including a plurality of parallel coupled sets of delay stages coupled, all at one end, to the first clock input, each set having at least one delay stage, each set having the delay stages serially coupled for the sets having more than one delay stage, the other end of each set coupled together to produce a first clock output signal for the first programmable delay group, a second programmable delay group including a plurality of parallel coupled sets of delay stages coupled, all at one end, to receive the second clock input, each set having at least one delay stage, each set having the delay stages serially coupled for the sets having more than one delay stage, the other end of each set coupled together to produce a second clock output signal for the second programmable delay group, a first control circuit for providing enable signals to a delay stage in each set of the first programmable delay group for selectively enabling one of the sets to delay the first clock input and transmit the first clock output signal, a second control circuit for providing enable signals to a delay stage in each set of the second programmable delay group for selectively enabling one of the sets to delay the second clock and transmit the second clock input signal, a circuit for providing programmable control signals to the first and second control circuits to provide the respective enable signals to the first and second programmable delay groups, wherein the first and second clock output signals are skewed with respect to the first and second clock input signals, respectively.

2. The programmable clock delay system of claim 1 wherein said first control circuit is an encoder having outputs respectively connected to an enable input of a last delay stage in each set of the first programmable delay group.

3. The programmable clock delay system of claim 1 wherein said second control circuit is an encoder having outputs respectively connected to an enable input of a last delay stage in each set of the second programmable delay group.

4. The programmable clock delay system of claim 1 wherein each of said delay stages have identical delays.

5. The programmable clock delay system of claims 1, 2 or 3 where said first programmable delay group includes a first set of delay stages having one delay stage, a second set of delay stages having two delay stages, a third set of delay stages having three delay stages and a fourth set of delay stages having four delay stages.

6. The programmable clock delay system of claims 1, 2 or 3 where said second programmable delay group includes a first set of delay stages having one delay stage, a second set of delay stages having three delay stages, a third set of delay stages having five delay stages and a fourth set of delay stages having seven delay stages.

7. The programmable clock delay system of claim 1 further comprising:

a clock divider having an input for receiving the first clock output signal and having an output for providing a divide by N clock signal at a predetermined cycle rate.

8. The programmable clock delay system of claim 1 further comprising:

a clock divider having an input for receiving the second clock output signal and having an output for providing a divide by N clock signal at a predetermined cycle rate.

* * * * *